US008494817B1

(12) United States Patent
Rao

(10) Patent No.: US 8,494,817 B1
(45) Date of Patent: Jul. 23, 2013

(54) METHODS FOR YIELD VARIABILITY BENCHMARKING, ASSESSMENT, QUANTIFICATION, AND LOCALIZATION

(75) Inventor: Suraj Rao, San Jose, CA (US)

(73) Assignee: PDF Solutions, Inc., San Jose, CA (US)

( * ) Notice: Subject to any disclaimer, the term of this patent is extended or adjusted under 35 U.S.C. 154(b) by 1820 days.

(21) Appl. No.: 11/565,573

(22) Filed: Nov. 30, 2006

(51) Int. Cl.
*G06F 7/60* (2006.01)

(52) U.S. Cl.
USPC .............. 703/2; 702/81; 438/12; 438/14

(58) Field of Classification Search
None
See application file for complete search history.

(56) References Cited

U.S. PATENT DOCUMENTS

| | | | | |
|---|---|---|---|---|
| 5,506,154 A * | 4/1996 | Kawahara et al. | ............ | 438/471 |
| 5,539,752 A * | 7/1996 | Berezin et al. | ................ | 714/724 |
| 5,761,064 A * | 6/1998 | La et al. | ......................... | 700/110 |
| 5,943,693 A * | 8/1999 | Barth | ............................ | 711/220 |
| 6,184,068 B1 * | 2/2001 | Ohtani et al. | ................ | 438/151 |
| 6,326,248 B1 * | 12/2001 | Ohtani et al. | ................ | 438/151 |
| 6,521,492 B2 * | 2/2003 | Miyasaka et al. | ............ | 438/166 |
| 6,602,765 B2 * | 8/2003 | Jiroku et al. | .................. | 438/487 |
| 6,635,872 B2 * | 10/2003 | Davidson | ...................... | 250/307 |
| 6,792,366 B2 * | 9/2004 | Hosoya et al. | ................. | 702/83 |
| 6,813,572 B2 * | 11/2004 | Satya et al. | ..................... | 702/82 |
| 7,496,874 B2 * | 2/2009 | Bickford et al. | ............. | 716/106 |
| 7,730,434 B2 * | 6/2010 | Aghababazadeh et al. | ... | 716/136 |
| 7,808,265 B2 * | 10/2010 | Garcia et al. | ............... | 324/750.3 |
| 7,937,234 B2 * | 5/2011 | St. Pierre et al. | ............... | 702/81 |
| 8,290,753 B2 * | 10/2012 | Tryon et al. | ......................... | 703/2 |
| 2002/0052069 A1 * | 5/2002 | Jiroku et al. | .................. | 438/166 |
| 2002/0058366 A1 * | 5/2002 | Miyasaki et al. | ............. | 438/166 |
| 2002/0145112 A1 * | 10/2002 | Davidson | ...................... | 250/307 |
| 2003/0097228 A1 * | 5/2003 | Satya et al. | ..................... | 702/82 |
| 2003/0109070 A1 * | 6/2003 | Hosoya et al. | .................. | 438/14 |
| 2005/0117793 A1 * | 6/2005 | Engelbart et al. | ............. | 382/141 |
| 2008/0015827 A1 * | 1/2008 | Tryon et al. | ......................... | 703/2 |
| 2008/0099762 A1 * | 5/2008 | Garcia et al. | .................... | 257/48 |
| 2009/0191348 A1 * | 7/2009 | Hieslmair et al. | ......... | 427/398.1 |
| 2011/0047523 A1 * | 2/2011 | Garcia et al. | .................. | 716/122 |

OTHER PUBLICATIONS

Harrison, N., "A simple via duplication tool for yield enhancement," Defect and Fault Tolerance in VLSI Systems, 2001. Proceedings. 2001 IEEE International Symposium on , vol., No., pp. 39,47, 2001.*
Allan, Gerard A., "Targeted layout modifications for semiconductor yield/reliability enhancement," Semiconductor Manufacturing, IEEE Transactions on , vol. 17, No. 4, pp. 573,581, Nov. 2004.*
Yan, J.-T., "Optimal via minimisation by selection of layer assignment and routing ordering in a bubble-sorting-based non-Manhattan channel," Computers and Digital Techniques, Iee Proceedings—, vol. 150, No. 1, pp. 21,27, Jan. 20, 2003.*

* cited by examiner

*Primary Examiner* — Gurkanwaljit Singh

(57) ABSTRACT

A method is disclosed for localizing product yield variability to a process module. The method includes obtaining fail rate and critical area data for each process module layer in a number of test chips. A variance in a defect density (DD) probability density function (PDF) is determined based on the obtained fail rate and critical area data for each process module layer. A percent contribution from each process module layer to the variance in DD PDF is determined. Based on the determined percent contribution to the variance in DD PDF from each process module layer, one or more process module layers are identified as contributing to the determined variance in the DD PDF. Additionally, a method is provided to assess the impact on product yield due to reduction in the yield variability associated with a particular process module layer.

7 Claims, 15 Drawing Sheets

| Process Module Layer | $Y_T$ | $Y_C$ | VarLY | Ygap |
|---|---|---|---|---|
| Rx opens/shorts | 0.99 | 0.92 | 1 | 0.93 |
| Poly opens/shorts | 0.97 | 0.90 | 0.98 | 0.94 |
| Mx and Via open | 0.91 | 0.79 | 0.97 | 0.90 |
| Mx shorts | 0.97 | 0.93 | 1 | 0.96 |
| Upper metal and via | 1.00 | 0.99 | 1 | 0.99 |
| MC opens | 0.99 | 0.92 | 0.96 | 0.96 |
| MC.contacts and CA opens | 0.90 | 0.71 | 1 | 0.79 |
| MC related shorts | 0.98 | 0.91 | 1 | 0.92 |
| Virgin Yield | 0.74 | 0.36 | | |
| Predicted Repair | 0.74 | 0.52 | 0.91 | |
| Observed Candidate Product Baseline | | 0.51 | | |

Fig. 12

METHODS FOR YIELD VARIABILITY BENCHMARKING, ASSESSMENT, QUANTIFICATION, AND LOCALIZATION

BACKGROUND

In semiconductor manufacturing, a yield ramp for a product, i.e., chip, represents the yield of the product as a function of time beginning with production of the first product unit. It is desirable to maximize the gradient of the yield ramp, i.e., optimize the product yield ramp, so that the product reaches a mature state of production at the earliest possible time. To optimize the product yield ramp it is useful to characterize the product defectivity and systematic loss mechanisms that detract from product yield. However, as technology moves into deeper submicron regimes, manufacturing variation is becoming more significant in detracting from achievement of high product yields. Therefore, to facilitate yield ramp optimization at the deeper submicron technology nodes, solutions are needed to better characterize product yield variability as it relates to the manufacturing process.

SUMMARY

In one embodiment, a computer implemented method is disclosed for localizing product yield variability to a process module. The method includes an operation for obtaining fail rate and critical area data for each process module layer in a number of test chips. Based on the obtained fail rate from the test chip and critical area data from the product layout for each process module layer, a variance in a defect density (DD) probability density function (PDF) is determined. The method also includes determining a percent contribution from each process module layer to the variance in DD PDF. Based on the percent contribution to the variance in DD PDF from each process module layer, an operation is performed to identify one or more process module layers that contribute to the determined variance in the DD PDF.

In another embodiment, a computer implemented method is disclosed for estimating an impact on product yield due to reduction in yield variability. The method includes an operation for determining a current mean limited yield distribution for each process module layer within the product using a test chip. Also, a target yield and a target percent variance reduction is established for each process module layer. The method further includes determining a new mean limited yield distribution for each process module layer based on the current mean limited yield distribution, the target yield, and the target percent variance reduction for the corresponding process module layer. A variability limited yield gap to target is determined for each process module layer as a ratio of the current mean limited yield distribution to the new mean limited yield distribution. Then, a product of the variability limited yield gap to target of the process module layers is determined. The method continues with an operation for determining a percent difference between a current mean test chip yield and the product of the variability limited yield gap to target of the process module layers. The percent difference represents an amount of yield improvement expected due to reduction of yield variability by the target percent variance reduction for each process module layer.

In another embodiment, a computer implemented method is disclosed for benchmarking product yield with respect to median defect density (DD). The method includes an operation for generating a DD cumulative density function (CDF) for a baseline product. Also, a DD CDF is generated for a candidate product. The method also includes determining a difference between the median DD of the candidate product and the median DD of the baseline product by using the generated DD CDFs for the baseline and candidate products. The method further includes an operation for assessing the difference between the median DD of the candidate and baseline products.

In another embodiment, a computer implemented method is disclosed for benchmarking product yield with respect to wafer-to-wafer (W2W) defect density (DD) variability. The method includes an operation for generating a W2W DD probability density function (PDF) for a baseline product. Also, a W2W DD PDF is generated for a candidate product. The method also includes forward integrating the W2W DD PDF for the baseline product from a particular W2W DD that corresponds to a positive multiple of a median W2W DD for the baseline product. An operation is also performed to forward integrate the W2W DD PDF for the candidate product from a particular W2W DD that corresponds to the positive multiple of a median W2W DD for the candidate product. The method further includes comparing a result of the forward integrating of the W2W DD PDF for the baseline product to a result of the forward integrating of the W2W DD PDF for the candidate product, to determine if the candidate product W2W DD PDF falls at a faster or slower rate relative to the baseline product W2W DD PDF.

In another embodiment, a computer implemented method is disclosed for benchmarking product yield variability against inherent sampling variability. The method includes an operation for generating a product yield probability density function (PDF) based on product yield data. Also, a product yield cumulative density function (CDF) is generated from the product yield PDF. The method also includes an operation for randomly sampling a binomial distribution to generate data representing a natural sampling variability associated with the product yield data. A natural sampling variability CDF is then generated from the randomly sampled binomial distribution data. The method further includes comparing the product yield CDF to the natural sampling variability CDF, to determine an amount of variability within the product yield data that is attributable to natural sampling variability.

Other aspects of the invention will become apparent from the following detailed description, taken in conjunction with the accompanying drawings, illustrating by way of example the principles of the invention.

BRIEF DESCRIPTION OF THE DRAWINGS

FIG. 12 is an illustration showing an exemplary application of the method for determining an estimated impact on candidate product yield due to reduction in yield variability associated with particular process modules.

DETAILED DESCRIPTION

Figure 1A:
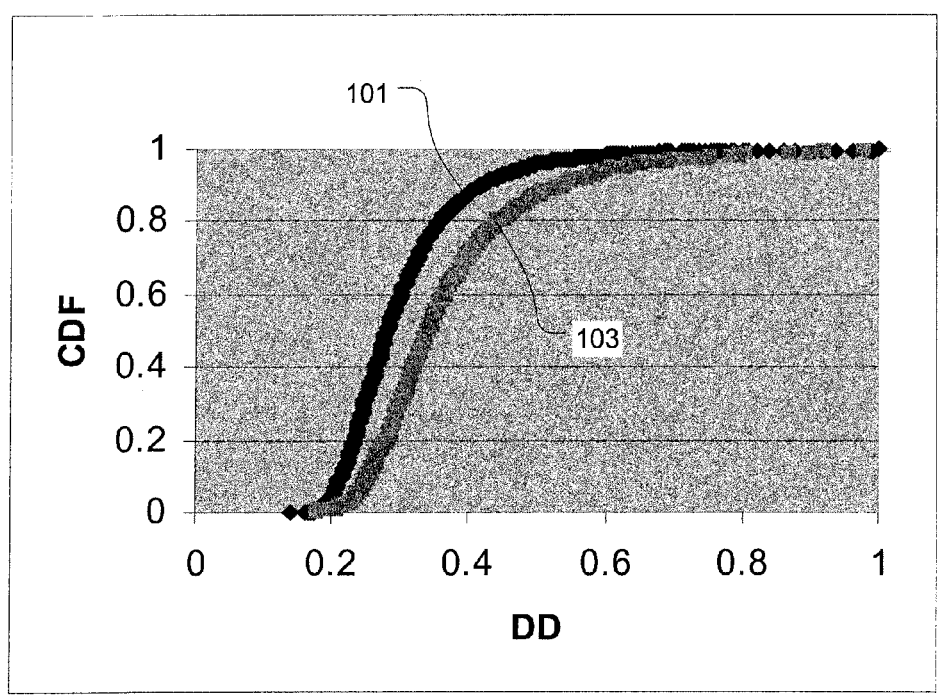
FIG. 1A is an illustration showing a comparison of a candidate product defect density (DD) cumulative density function (CDF) and a baseline product DD CDF, in accordance with one embodiment of the present invention.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

It should be appreciated that the present invention can be implemented in numerous ways, including as a process, an apparatus, a system, a device, or a method. Several exemplary embodiments of the invention will now be described in detail with reference to the accompanying drawings.

Benchmarking of Yield Variability

During a products yield ramp phase it is beneficial to consider whether or not the product yield variation is too high. In determining whether the product yield variation is too high, it is necessary to compare the product yield variation to a benchmark yield variation. For discussion purposes, a product progressing through its yield ramp is referred to a "candidate product." A "baseline product" refers to a product that has essentially completed its yield ramp phase and is similar to the candidate product. Thus, yield data associated with the baseline product represents the state of the art and is appropriate for use in evaluating whether or not the yield data obtained for the candidate product is within expected/acceptable bounds. More specifically, benchmarking can be accomplished by comparing the observed candidate product yield variability data to the baseline product yield variability data as the candidate product progresses along its yield ramp. It should be appreciated that the results obtained from benchmarking enables a determination as to whether or not further investment in candidate product yield variability reduction is warranted.

Several methods for benchmarking the candidate product yield data are disclosed herein. In one embodiment, the candidate product yield data is benchmarked by comparing a median defect density of the candidate product to a median defect density of the baseline product. Product (either candidate or baseline) yield (Y) is represented mathematically as shown in Equation 1. With regard to Equation 1, (i) represents a particular process module layer, i.e., chip layer, ($A_i$) represents a critical area for the process module layer (i), and ($D_i$) represents a fail rate for the process module layer (i). Product defect density (DD) is represented mathematically as shown in Equation 2. With regard to Equation 2, ($A_{chip}$) represents a total area of the chip. Also, the DD of Equation 2 refers to a full-wafer DD.

$$Y = \exp\left(-\left(\sum_i A_i D_i\right)\right). \quad \text{Equation 1}$$

$$DD = \frac{-\ln(Y)}{A_{chip}} = \sum_i \left(\frac{A_i}{A_{chip}}\right) D_i. \quad \text{Equation 2}$$

It should be appreciated that the benchmarking methods described herein involve comparisons made in DD space. By making comparison in DD space, differences in chip size between the candidate product and baseline product are normalized out. If the chip size differences were not normalized out, the yield distributions of the candidate and baseline products would not be comparable in median or spread, thus making it difficult to draw meaningful inferences on yield variability.

FIG. 1A is an illustration showing a comparison of a candidate product defect density (DD) cumulative density function (CDF) 103 and a baseline product DD CDF 101, in accordance with one embodiment of the present invention. The DD data represented in FIG. 1A refers to full-wafer DD as given by Equation 2. Visual observation of the CDFs in FIG. 1A show that the candidate product's DD is greater than the baseline product's DD. Quantitatively, in the example of FIG. 1A, the candidate product's median DD (CDF=0.5) is 0.341, and the baseline product's median DD (CDF=0.5) is 0.280. Thus, in terms of yield (Y), the candidate product's yield (Y) of 0.558 (55.8%) is about 6% less than the baseline product's yield (Y) of 0.619.

Figure 1B:
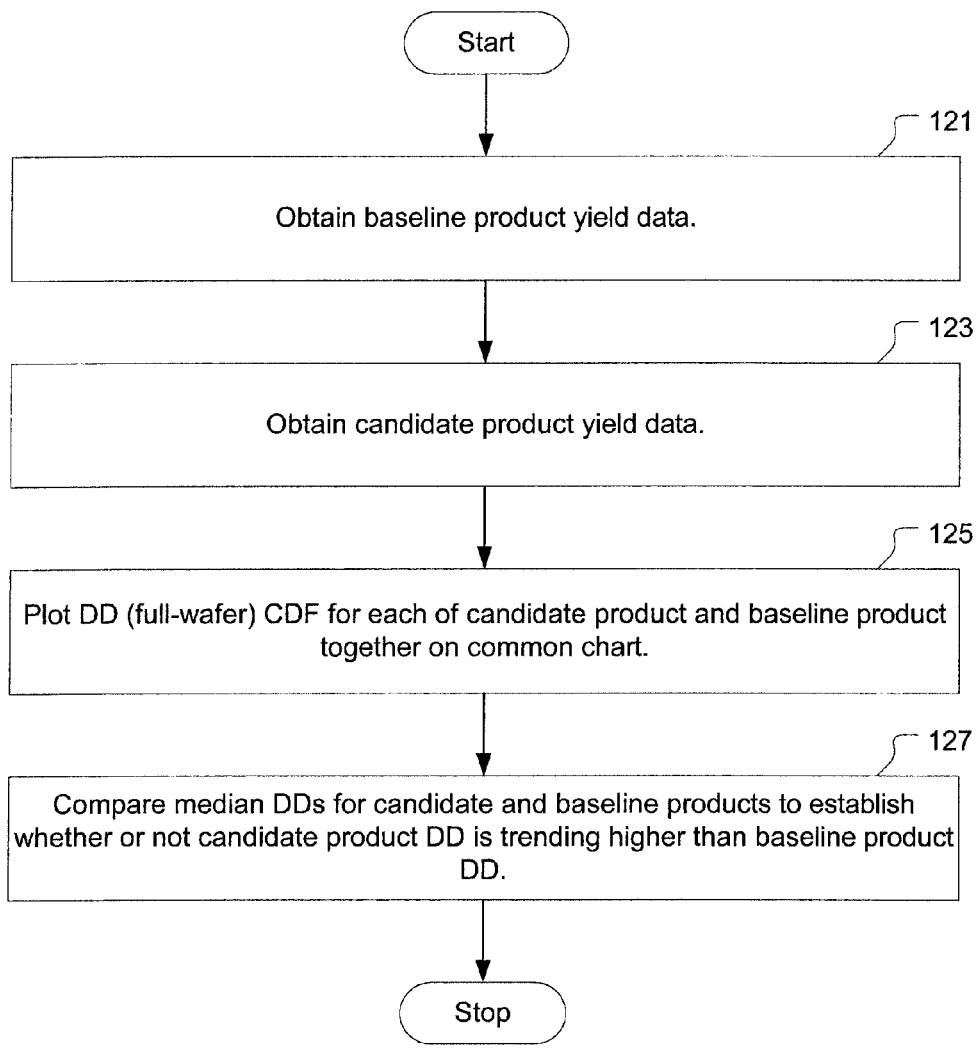
FIG. 1B is an illustration showing a flowchart of a method for benchmarking a candidate product yield with respect to median DD, in accordance with one embodiment of the present invention.

FIG. 1B is an illustration showing a flowchart of a method for benchmarking a candidate product yield with respect to median DD, in accordance with one embodiment of the present invention. In an operation 121, baseline product yield data is obtained. In an operation 123, candidate product yield data is obtained. Because the candidate product is still within its yield ramp phase, the quantity of available yield data for the candidate product will likely be much less than that for the baseline product. Also, with regard to layout design and fabrication processes, the baseline product should be sufficiently similar to the candidate product to enable a meaningful comparison of their yield data. The method continues with an operation 125 for plotting the DD (full-wafer) CDF for each of the candidate product and the baseline product together on a common chart. In an operation 127, the median DDs for the candidate and baseline products are compared to establish whether or not the candidate product DD is trending higher than the state of the art as indicated by the baseline product DD. The result of operation 127 can be used to determine whether further investment in yield variability benchmarking and/or yield variability correction is warranted for the candidate product.

In another embodiment, the candidate product yield data is benchmarked by comparing a wafer-to-wafer (W2W) DD variation of the candidate product to a W2W DD variation of the baseline product. The W2W DD variation benchmarking method disclosed herein is independent of a type or shape of the W2W DD distributions for the candidate and baseline products. More specifically, rather than using a single variability metric, the W2W DD variation benchmarking method disclosed herein implements a non-parametric approach. This non-parametric approach compares a rate of fall of the W2W DD distribution of the candidate product to that of the baseline product.

Figure 2A:
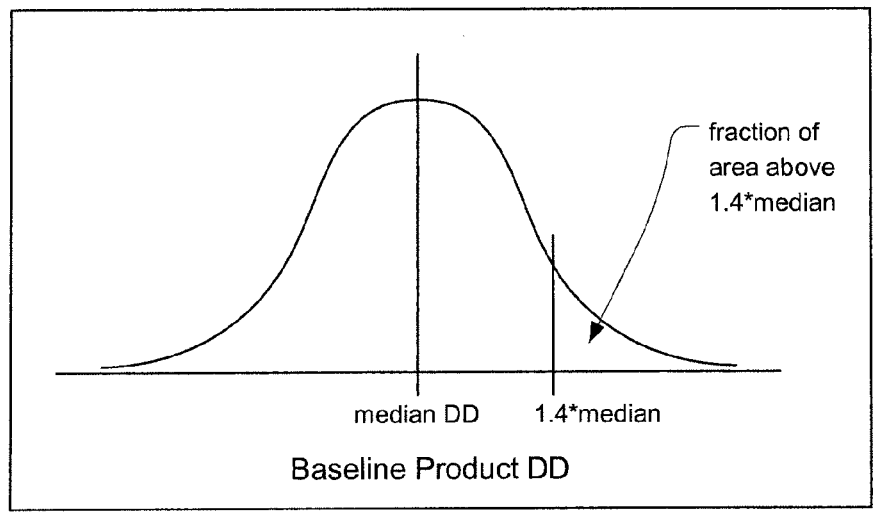
FIG. 2A is an illustration showing an exemplary baseline product W2W DD distribution.
Figure 2B:
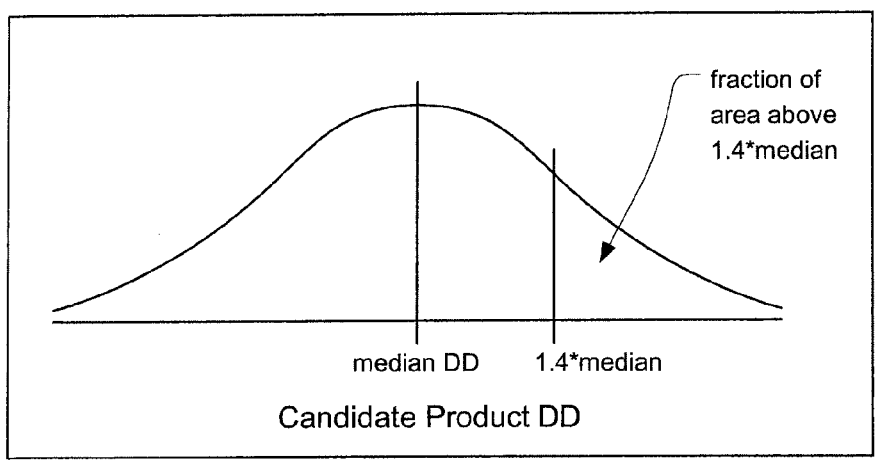
FIG. 2B is an illustration showing an exemplary candidate product W2W DD distribution.

FIG. 2A is an illustration showing an exemplary baseline product W2W DD distribution. FIG. 2B is an illustration showing an exemplary candidate product W2W DD distribution. To compare the rate of fall of the candidate product's W2W DD distribution to that of the baseline product's W2W DD distribution, an area of each W2W DD distribution above a common factor of the median W2W DD is compared. For example, if the common factor of the median is 1.4, the area of the candidate product's W2W DD distribution above 1.4 times the median W2W DD for the candidate product is compared to the area of the baseline product's W2W DD distribution above 1.4 times the median W2W DD for the baseline product. If the area of the candidate product's W2W DD distribution above the common factor of the median is larger than that of the baseline product, the candidate product W2W DD falls at a slower rate than the baseline product, vice-versa.

Figure 2C:
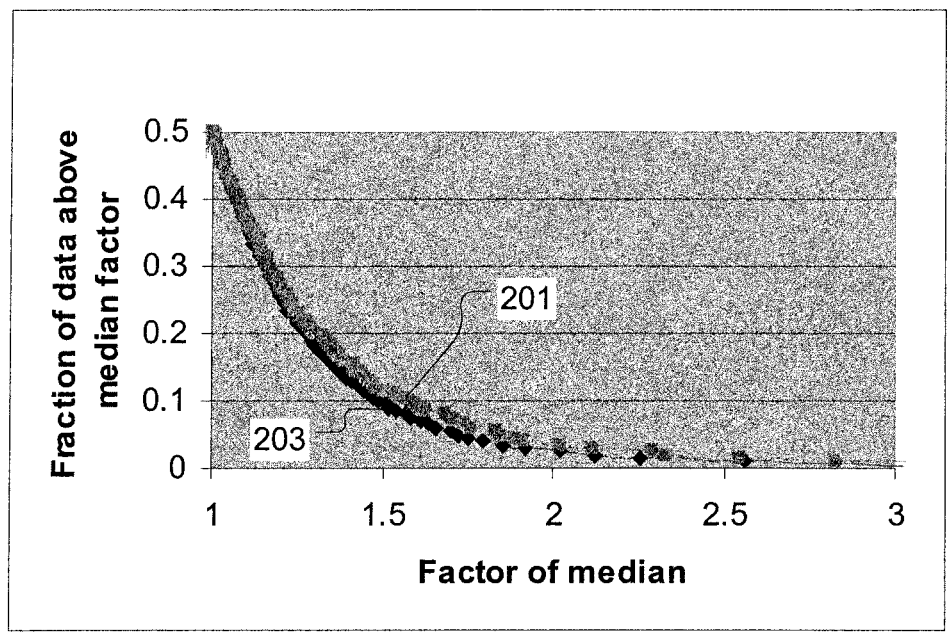
FIG. 2C is an illustration showing a comparison of W2W DD distributions between a candidate product and a baseline product in terms of W2W DD above factor of median, in accordance with one embodiment of the present invention.

FIG. 2C is an illustration showing a comparison of W2W DD distributions between a candidate product and a baseline product in terms of W2W DD above factor of median, in accordance with one embodiment of the present invention. For the candidate product, the W2W DD distribution above a factor of the median is integrated and plotted against the factor of the median, for factors of the median extending from 1 to 3, as shown by curve 201. Similarly, for the baseline product, the W2W DD distribution above a factor of the median is integrated and plotted against the factor of the median for factors of the median extending from 1 to 3, as shown by curve 203. Each of curves 201 and 203 is referred to as a forward integration curve of the corresponding W2W DD distribution. The data of FIG. 2C shows that the W2W DD for the baseline product falls at a faster rate than the W2W DD for the candidate product. This effectively means that there is less variance in the W2W DD for the baseline product as compared to the candidate product. Thus, there is a potential for improvement in the candidate product by reducing its W2W DD variance to more closely match the state of the art as represented by the baseline product.

Figure 3:
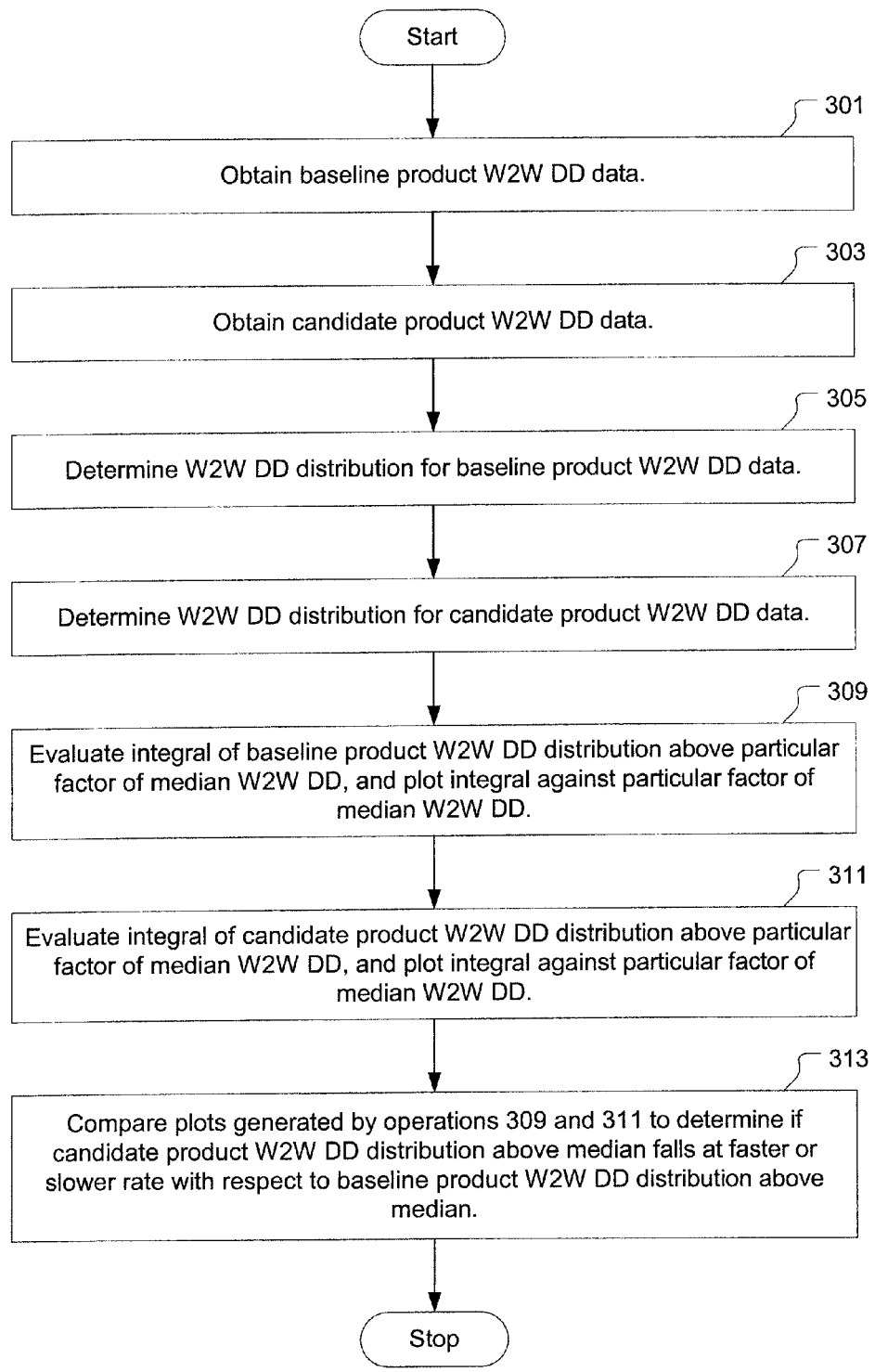
FIG. 3 is an illustration showing a flowchart of a method for benchmarking a candidate product W2W DD variation, in accordance with one embodiment of the present invention.

FIG. 3 is an illustration showing a flowchart of a method for benchmarking a candidate product W2W DD variation, in accordance with one embodiment of the present invention. The method includes an operation 301 for obtaining baseline product W2W DD data, and an operation 303 for obtaining candidate product W2W DD data. In an operation 305, a W2W DD distribution for the baseline product W2W DD data is determined. In an operation 307, a W2W DD distribution for the candidate product W2W DD data is determined. The W2W DD distribution determination for each of the baseline and candidate products includes determination of the corresponding median W2W DD. In an operation 309, an integral of the baseline product W2W DD distribution above a particular factor of the median baseline product W2W DD is evaluated and plotted against the particular factor of the median. Operation 309 is performed for factors of the median extending between 1 and 3. In an operation 311, an integral of the candidate product W2W DD distribution above a particular factor of the candidate product median W2W DD is evaluated and plotted against the particular factor of the median. Operation 311 is performed for factors of the median extending between 1 and 3.

In an operation 313, the plots generated by operations 309 and 311 are compared to determine if the candidate product W2W DD distribution above the median falls at a faster or slower rate with respect to the baseline product W2W DD distribution above the median. A candidate product W2W DD distribution that falls slower than the baseline product W2W DD distribution is indicative of more variability in the candidate product W2W DD distribution as compared that of the baseline product. The result of operation 313 can be used to determine whether further investment in yield variability benchmarking and/or yield variability correction is warranted for the candidate product.

It should be appreciated that the above-described method for benchmarking candidate product W2W DD variation can be utilized without regard to the type and shape of the W2W DD distributions of the candidate and baseline products, respectively. Therefore, the W2W DD distributions of the candidate and baseline products can be completely arbitrary with regard to implementing the above-described method for benchmarking candidate product W2W DD variation. Furthermore, with regard to FIG. 2C, the forward integration curves 201 and 203 enable calculation of the yield impact due to reduction in the candidate product's yield variability to that of the baseline product. More specifically, the yield impact due to reducing the candidate product's yield variability to the baseline product's yield variability is defined as the area between the forward integration curves 201 and 203.

In another embodiment, the candidate product yield data is benchmarked by comparing a within-wafer DD variation of the candidate product to a within-wafer DD variation of the baseline product. Specifically, to benchmark wafer center-to-edge yield variability, the CDF of an edge limited DD is compared between the candidate product and the baseline product, where the edge limited DD is given by Equation 3. With regard to Equation 3, "overall yield" refers to the overall chip yield of the wafer, and "center yield" refers to the chip yield within a central region of the wafer. It should be appreciated that use of edge limited DD as defined by Equation 3, ensures that normalization is provided for chip area differences between the candidate product and the baseline product.

$$\text{Edge Limited } DD = \frac{-\ln(ELY)}{A_{chip}}, \quad \text{Equation 3}$$

$$\text{where } ELY = \frac{\text{Overall Yield}}{\text{Center Yield}}.$$

Figure 4:
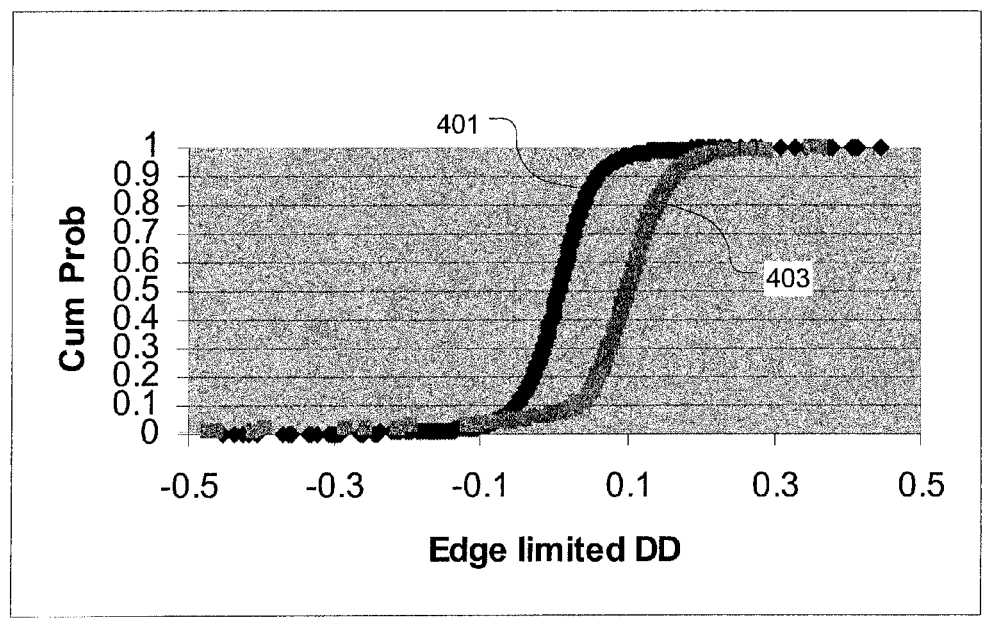
FIG. 4 is an illustration showing a comparison of a candidate product edge limited DD CDF and a baseline product edge limited DD CDF, in accordance with one embodiment of the present invention.

FIG. 4 is an illustration showing a comparison of a candidate product edge limited DD CDF 403 and a baseline product edge limited DD CDF 401, in accordance with one embodiment of the present invention. It should be understood that the negative portions of the edge limited DD CDFs 401 and 403 represent wafers where ELY is greater than one, i.e., wafers that have higher die yield at their edge as opposed to their central region. Observation of the edge limited DD CDFs 401 and 403 in FIG. 4 show that the candidate product's edge limited DD is substantially higher than the baseline product's edge limited DD. Quantitatively, in the example of FIG. 4, the candidate product's median edge limited DD (CDF=0.5) is 0.1015, and the baseline product's median edge limited DD (CDF=0.5) is 0.0068.

Figure 5:
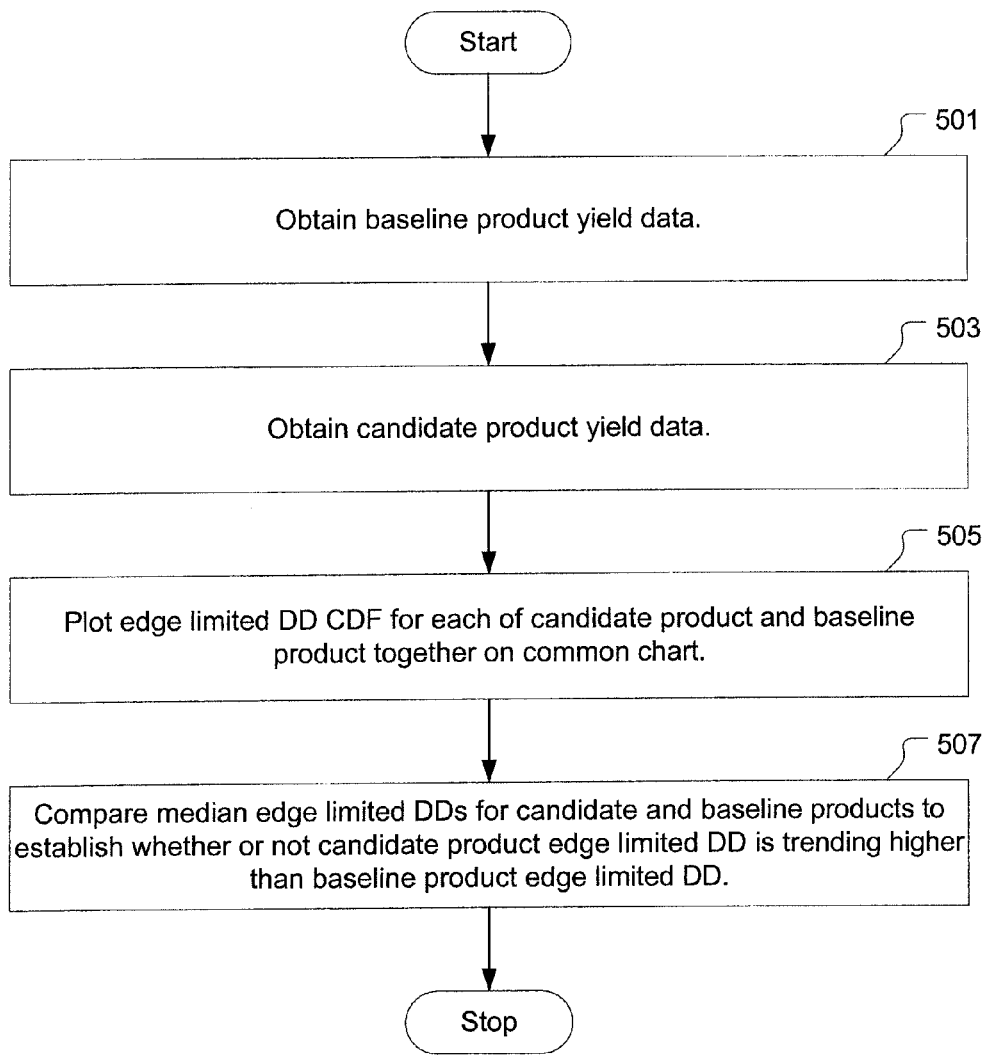
FIG. 5 is an illustration showing a flowchart of a method for benchmarking a candidate product yield with respect to edge limited DD, in accordance with one embodiment of the present invention.

FIG. 5 is an illustration showing a flowchart of a method for benchmarking a candidate product yield with respect to edge limited DD, in accordance with one embodiment of the present invention. In an operation 501, baseline product yield data is obtained. In an operation 503, candidate product yield data is obtained. Because the candidate product is still within its yield ramp phase, the quantity of available yield data for the candidate product will likely be much less than that for the baseline product. Also, with regard to layout design and fabrication processes, the baseline product should be sufficiently similar to the candidate product to enable a meaningful comparison of their yield data. The method continues with an operation 505 for plotting the edge limited DD (as given by Equation 3) CDF for each of the candidate product and the baseline product together on a common chart. In an operation 507, the median edge limited DDs for the candidate and baseline products are compared to establish whether or not the candidate product edge limited DD is trending higher than the state of the art as indicated by the baseline product edge limited DD. The result of operation 507 can be used to determine whether further investment should be considered to improve candidate product wafer uniformity between wafer center and wafer edge.

In another embodiment, sampling variation in the candidate product yield data is benchmarked against an expected inherent sampling variation. Benchmarking against the expected inherent sampling variation serves to identify how the variation in the candidate product yield data compares with a lower bound on sampling variation as defined by the inherent, i.e., natural sampling variation. Assessment on the lower bound of the candidate product's yield variability through comparison with inherent sampling variation requires quantification of the inherent sampling variation. To quantify the inherent sampling variation, the inherent sampling variation is assumed to follow the binomial distribution function ($f_B(x)$) as shown in Equation 4, wherein (p) is the mean yield per wafer and (n) is the number of die per wafer. As one skilled in the art will appreciate, for (n) discrete events where the probability of a given event is (p), the probability that this event will occur exactly (x) times is the value of the binomial distribution function ($f_B(x)$). Using the binomial distribution function of Equation 4, a random sampling is taken to establish a lower bound on the natural sampling variation that can be expected in the candidate product yield data.

$$f_B(x) = \frac{n! p^x (1-p)^{n-x}}{x!(n-x)!}. \quad \text{Equation 4}$$

Figure 6:
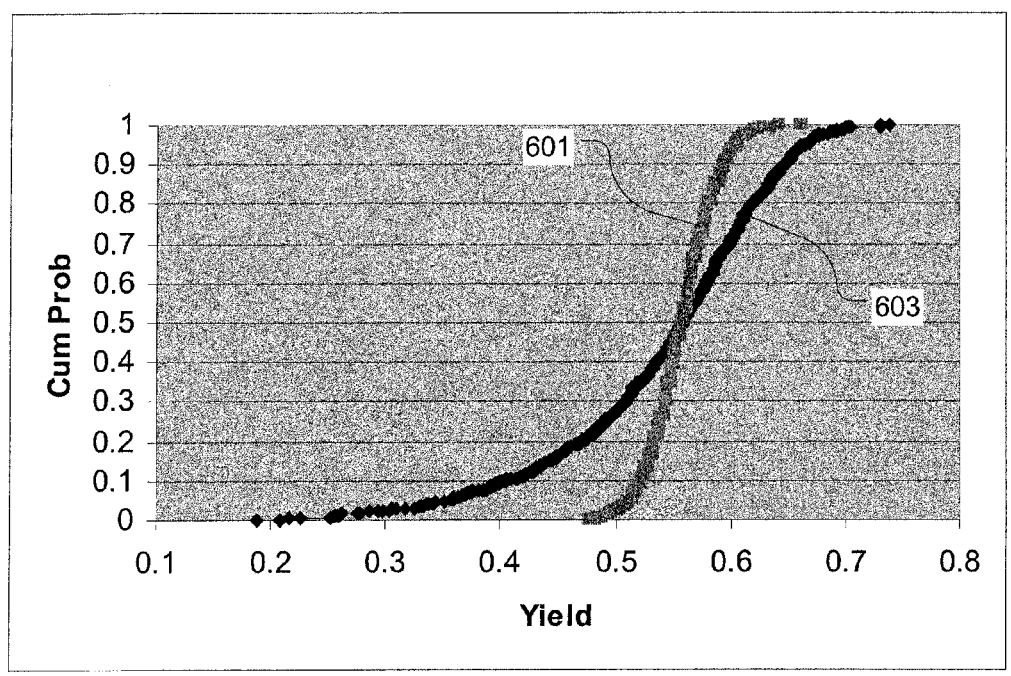
FIG. 6 is an illustration showing a comparison of a candidate product yield distribution CDF and a binomial distribution CDF, in accordance with one embodiment of the present invention.

FIG. 6 is an illustration showing a comparison of a candidate product yield distribution CDF 603 and a binomial distribution CDF 601 as described with regard to Equation 4, in accordance with one embodiment of the present invention. Observation of the CDFs 601 and 603 show that the variability in the candidate product yield distribution is greater than an inherent natural sampling variability as defined by the binomial distribution. Quantitatively, in the example of FIG. 6, a standard deviation of the candidate product yield data is 0.0955, and a standard deviation for the binomial distribution random sampling data is 0.026. Therefore, the standard deviation of the candidate product yield data is about 3.7 times that associated with the binomial distribution. Thus, observation of the CDFs 601 and 603 indicates that there is an amount of variability within the candidate product yield data, beyond natural sampling variability, that may need to be further evaluated for reduction.

Figure 7:
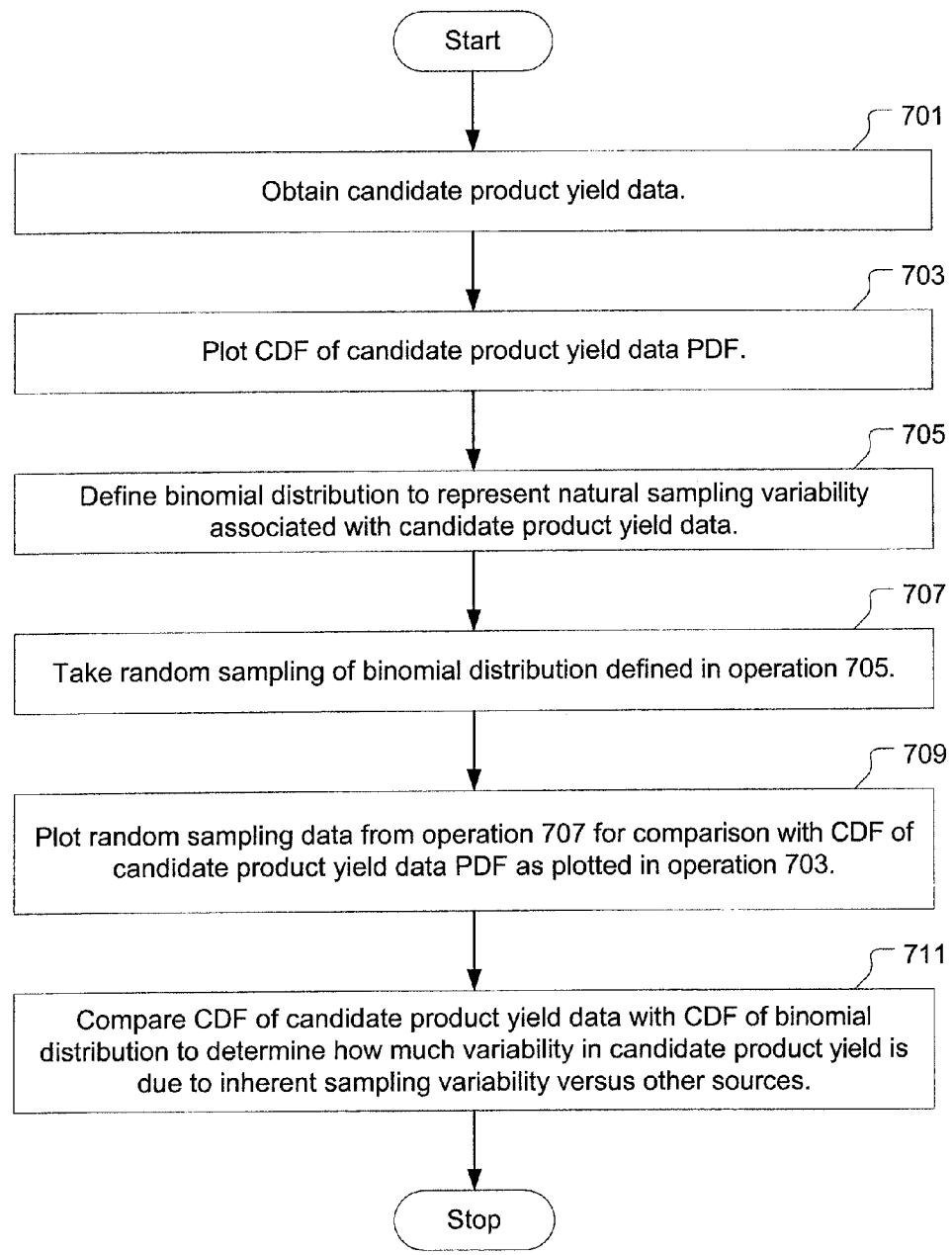
FIG. 7 is an illustration showing a flowchart of a method for benchmarking an amount of variability in candidate product yield data with an amount of expected inherent sampling variability, in accordance with one embodiment of the present invention.

FIG. 7 is an illustration showing a flowchart of a method for benchmarking an amount of variability in candidate product yield data with an amount of expected inherent sampling variability, in accordance with one embodiment of the present invention. In an operation 701, candidate product yield data is obtained. In an operation 703, the CDF of the candidate product yield data probability density function (PDF) is plotted. In an operation 705, a binomial distribution is defined to represent the natural sampling variability associated with the candidate product yield data. The binomial distribution defined in operation 705 is the same as that described above with regard to Equation 4.

In an operation 707, a random sampling is taken of the binomial distribution defined in operation 705. In an operation 709, the random sampling data from operation 707 is plotted for comparison with the CDF of the candidate product yield data PDF, as plotted in operation 703. In an operation 711, the CDF of the candidate product yield data is compared with the CDF of the binomial distribution to determine how much of the variability in the candidate product yield is due to inherent sampling variability and how much is due to other sources. The result of operation 711 can be used to determine whether further investment should be considered for reducing the observed variability in the candidate product yield data.

Localizing and Quantifying Yield Variability to Process Modules

Once the benchmarking indicates that further assessment and/or reduction of candidate product yield variability is of interest, it is desirable to localize and quantify the candidate product yield variability with respect to particular process module layers within the candidate product chip. To this end, one embodiment of the present invention discloses an additive variance method to enable prediction and localization of candidate product yield variability. The additive variance method allows for combination of yield variability data from various test chip sources, such as back end of line (BEOL) test chips and front end of line (FEOL) test chips that run in a yield ramp representative of the candidate product. The additive variance method enables localization and quantification of the fraction of yield variability assignable to each of the process module layers represented in the test chips and the candidate product chips.

The additive variance method utilizes a variability decomposition model that derives from the Poisson yield model previous discussed with respect to Equation 1. By dividing both sides of Equation 1 by the full product chip area ($A_{chip}$), the candidate product overall defect density (DD) is obtained as shown in previously discussed Equation 2. Equation 2 effectively expresses the predicted candidate product DD as a weighted sum of process module layer fail rates. Equation 2 is used to either predict or decompose the candidate product DD among the various process module layer fail rate (D0) contributions. Additionally, with regard to the additive variance method, Equation 2 can be used to decompose the candidate product variance. More specifically, by applying a variance operator to both sides of Equation 2, the relationship shown in Equation 5 is realized. With regard to Equation 5, "Cov.Terms" represents covariance terms to address the variability dependencies between different process module layers.

$$\text{Var}(DD) = \text{Var}\left[\sum_{i=1}^{n}\left(\frac{A_i}{A_{chip}}\right)D_i\right] = \sum_{i=1}^{n}\left(\frac{A_i}{A_{chip}}\right)^2 \text{Var}(D_i) + Cov.Terms \quad \text{Equation 5}$$

where $$Cov.Terms = 2\sum_{i=1, i<j}^{j \le n}\left(\frac{A_i}{A_{chip}}\right)\left(\frac{A_j}{A_{chip}}\right)\text{Cov}(D_i, D_j).$$

In the relationship of Equation 5, the variance is decomposed to its additive components, each of which can be associated with a specific process module layer. Several implications follow from Equation 5. For instance, the variance of the candidate product DD can be broken down into variance contributions from each independent process module. Furthermore, the dependence between process modules can be captured by the covariance terms. Also, because the variance is additive, it is possible to calculate a percentage contribution of variation from each process module.

If process modules are independent, the covariance terms become zero. Thus, the candidate product DD variance is the sum of the variance in the fail rate (D0) of the process module layers weighted by the square of the respective process module layer critical area. With independent process modules, the variance can be summed from various sources. For example, independent fail rate (D0) variation estimates can be obtained for the various test chip layers within a combination of BEOL test chips, FEOL test chips, and/or scribe test chips, and summed to predict the candidate product DD variation. Additionally, because variance increases with the square of the critical area of a given chip layer, a larger critical area for a given chip layer corresponds to a greater variability contribution from the given chip layer to the total candidate product yield variability.

It should be appreciated that the yield variability decomposition of Equation 5 holds true regardless of the underlying fail rate distributions. In other words, variance estimates and variance breakdown among process module layers can be made directly by using empirical data without requiring assumptions with regard to the underlying fail rate distributions for the various process module layers.

To demonstrate the additive variance method as applied to characterize candidate product yield variability using test chip based fail rate data, candidate product data from a 130 nm manufacturing process is considered. The candidate product is a logic chip with about 2 MB SRAM and no repair. The candidate product chip is a 5-metal layer Cu process manufactured in a 300 mm fab with a chip area of 0.604 $cm^2$. Over a three month period about 1870 wafers were manufactured for this low volume candidate product. During the same period, the fab was running BEOL and FEOL test chips on test wafers to facilitate yield ramp optimization of the candidate product. The fab ran 45 test wafers each for FEOL and BEOL.

Figure 8A:
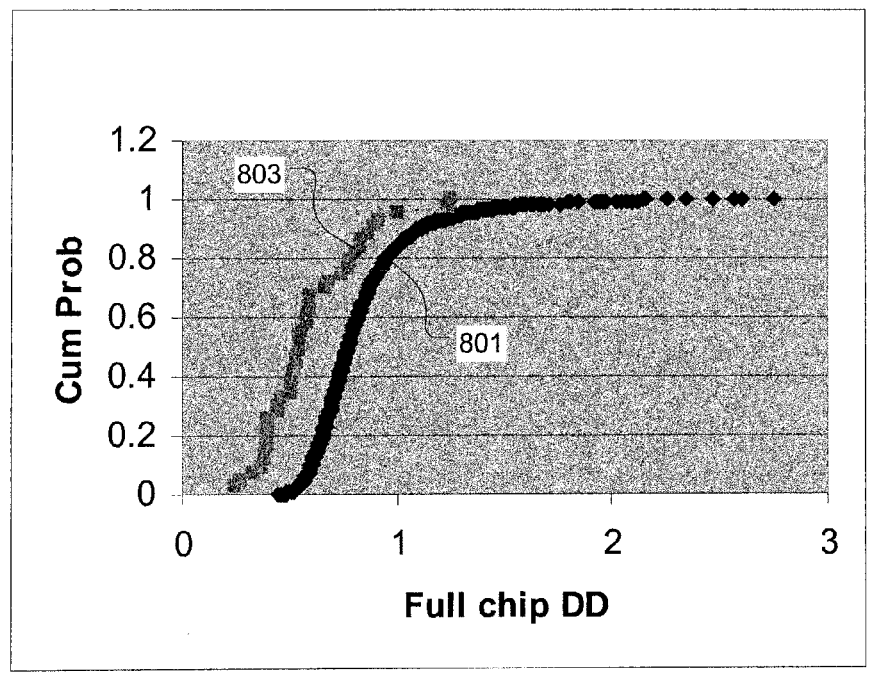
FIG. 8A is an illustration showing the candidate product DD CDF plotted in conjunction with the test chip data DD CDF, in accordance with an exemplary embodiment of the present invention.
Figure 8B:
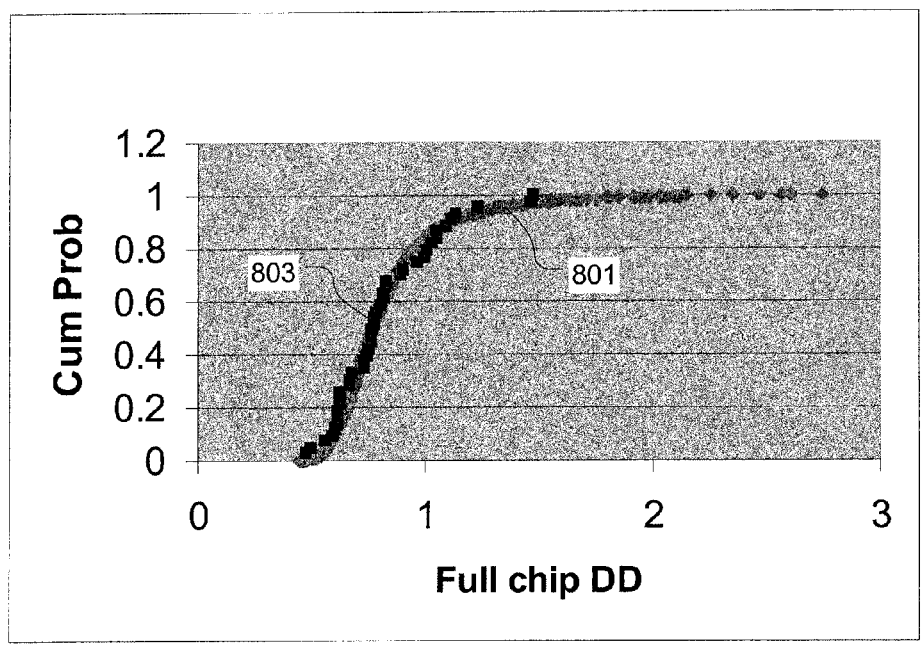
FIG. 8B is an illustration showing the CDFs of FIG. 8A with a constant offset added to match the medians of the CDFs, in accordance with an exemplary embodiment of the present invention.

FIG. 8A is an illustration showing the candidate product DD CDF 801 plotted in conjunction with the test chip data DD CDF 803, in accordance with an exemplary embodiment of the present invention. FIG. 8B is an illustration showing the CDFs of FIG. 8A with a constant offset added to match the medians of the CDFs, in accordance with an exemplary embodiment of the present invention. The offset added in FIG. 8B represents the slightly lower defect limited DD predicted by test chip data versus the actual DD observed for the candidate product. As seen in FIG. 8B, after adjusting for the median constant offset, the two CDFs 801 and 803 show very similar slopes. The similarity in slope suggests similar variance between the two datasets. Quantitatively, the test chip predicted DD variance of 0.055 was found to be close to candidate product DD variance of 0.066. Thus, the test chips explain almost 83% of the yield variability present within the candidate product DD. Therefore, it should be appreciated that test chip data obtained from the test wafers representing just 5% of the candidate product wafer volume, i.e., (2*45 test wafers/1870 candidate product wafers), is able to explain more than 80% of candidate product DD variance.

It is informative to consider how the variability observed in the limited volume of test wafer data (5% of the candidate product wafer volume) manifests in the much higher volume of candidate product data. In this consideration, one could speculate with regard to possible physical phenomena that may explain the close representation of the candidate product DD by the test chip predicted DD. For instance, in the example of FIGS. 8A-8B, the local interconnect (LI) had the highest critical area. Based on our formulation, the LI process module layer will have the most significant contribution to variation in candidate product DD. Therefore, by way of example, if the LI etch process or associated etch tool is marginal, this marginality will show up in the candidate product yield variability. Similarly, if there is chamber variation in an anneal step at the LI process module layer, the high critical area in this LI layer will cause an exaggerated impact on the candidate product DD variation. It should be appreciated that the above discussion regarding the LI process module layer is provided for exemplary purposes. In reality, each process module layer may contribute to the yield variability, wherein the associated yield variability contribution is driven by particular physical phenomena.

The example described with regard to FIGS. 8A-8B demonstrates the potential of using test chip fail rate data to model and capture a large portion of the candidate product yield variability. Given that the test chip data is capable of representing the variability in the candidate product yield, it is appropriate to consider localizing the variability predicted by the test chip data to the various process modules. It should be appreciated that localization of the yield variability to the various process modules is useful for prioritization of variability reduction efforts. Equation 5 can be used to quantify the percent variation contribution from the $i^{th}$ process module layer as shown in Equation 6.

$$\text{Percent Variation from } i^{th} \text{ Layer} = \frac{\left(\frac{A_i}{A_{chip}}\right)^2 \text{Var}(D_i)}{\text{Var}\left(\sum_i \left(\frac{A_i}{A_{chip}}\right) D_i\right)}. \quad \text{Equation 6}$$

Figure 9:
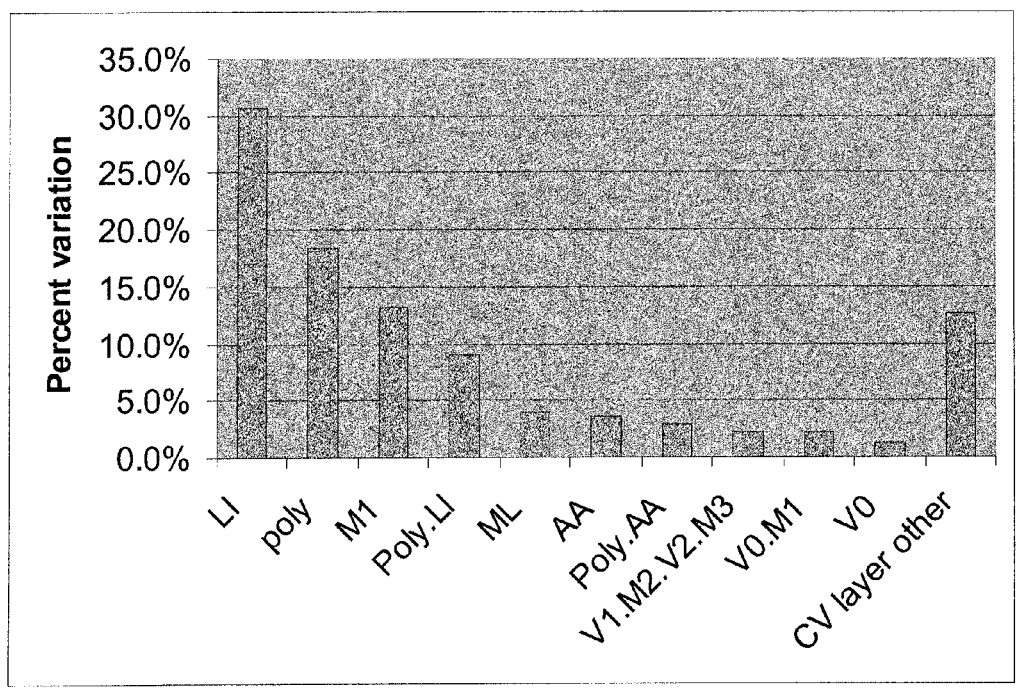
FIG. 9 is an illustration showing the DD variance breakdown among the various process modules for the above-described example of FIGS. 8A-8B.

FIG. 9 is an illustration showing the DD variance breakdown among the various process modules for the above-described example of FIGS. 8A-8B. As illustrated in FIG. 9, the LI module contributes 30% of the DD variability, and the poly (polysilicon) module contributes another 18% of the DD variability. Also, the LI, poly, and M1 (metal 1) modules together account for 71% of the DD variability predicted by the test chip data. Furthermore, the interaction between process modules, i.e., covariance terms, can also captured through application of Equation 6. For example, with regard to FIG. 9, interaction between the LI and poly modules (Poly.LI) account for about 9% of the yield variation.

The above examples demonstrate that the additive variance method can be applied to test chip data to capture a large portion of the candidate product yield variability and localize the yield variability to the various process modules to facilitate variability reduction efforts. Also, the above examples demonstrate that the additive variance method provides significant flexibility in combining variance data from a variety of sources to predict the yield variability for the candidate product.

Figure 10:
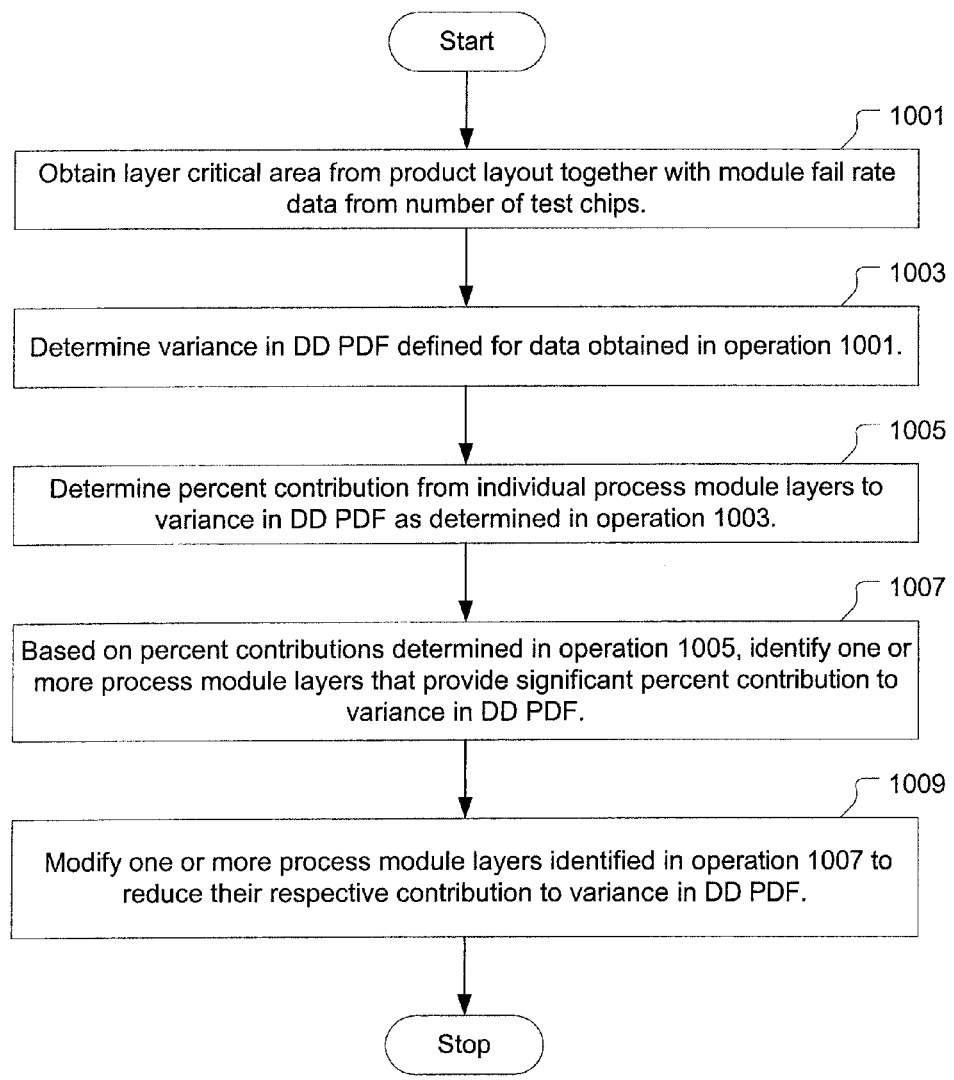
FIG. 10 is an illustration showing a flowchart of a method for localizing yield variability to a process module, in accordance with one embodiment of the present invention.

FIG. 10 is an illustration showing a flowchart of a method for localizing yield variability to a process module, in accordance with one embodiment of the present invention. The method includes an operation 1001 for obtaining layer critical area from product layout together with module fail rate data from a number of test chips. The test chips from which data is obtained in operation 1001 are representative in layout and fabrication process to a particular candidate product. An operation 1003 is performed to determine a variance in a DD PDF defined for the data obtained in operation 1001. The variance in the DD PDF is determined in accordance with Equation 5, as previously discussed. An operation 1005 is performed to determine a percent contribution from individual process module layers to the variance in the DD PDF as determined in operation 1003. The percent contribution from the individual process module layers is determined in accordance with Equation 6, as previously discussed.

The method continues with an operation 1007 to identify, based on the percent contributions determined in operation 1005, one or more process module layers that provide a significant percent contribution to the variance in the DD PDF. In one embodiment, the identification process of operation 1007 can be performed in a manner similar to that previously described with respect to FIG. 9. In an operation 1009, the one or more process module layers identified in operation 1007 are modified to reduce their respective contribution to the variance in the DD PDF. It is expected that a reduction in the variance of the DD PDF will have a corresponding mean yield increase effect.

Assessment of Yield Variance Reduction on Yield

Figure 11A:
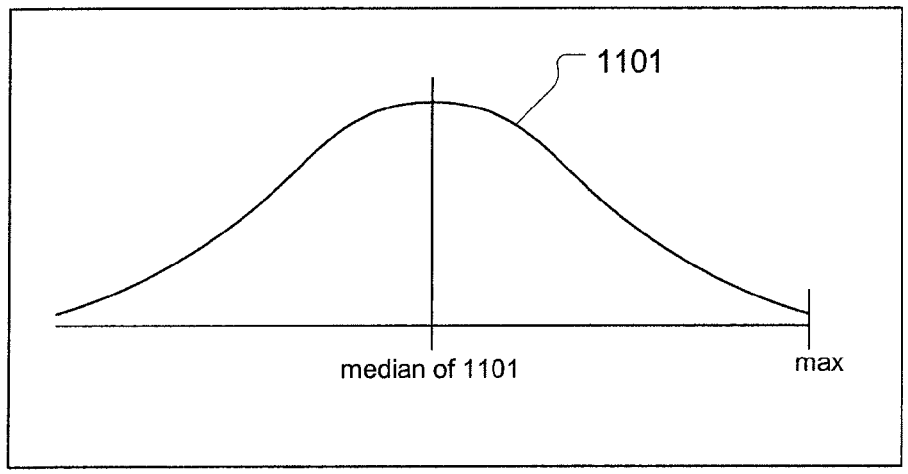
FIG. 11A is an illustration showing an observed yield PDF derived from test chip yield data for a given process module layer within the test chip.
Figure 11B:
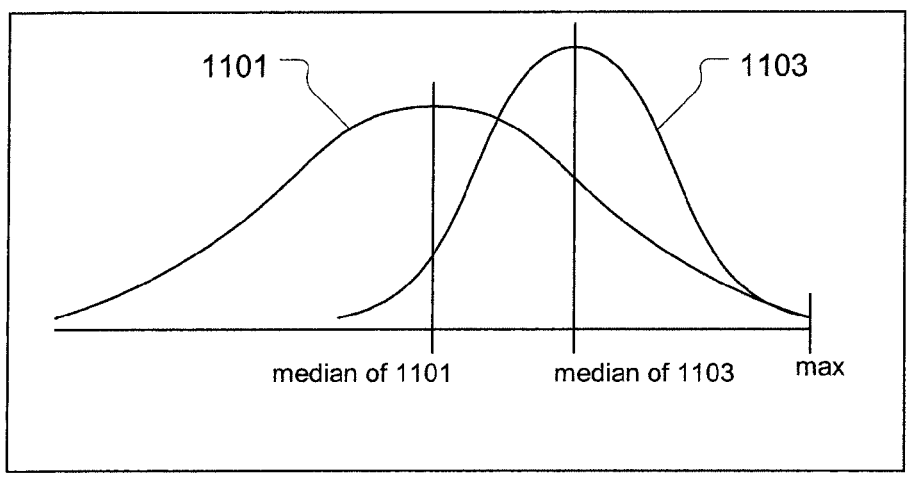
FIG. 11B is an illustration showing a new yield PDF based on application of a percent variance reduction target to the observed yield PDF, wherein the maximum of the new yield PDF is tied to the maximum of the observed yield PDF.

In one embodiment of the present invention, a method is provided for determining an estimated impact on candidate product yield due to reduction in yield variability associated with particular process modules. FIG. 11A is an illustration showing an estimated yield PDF 1101 derived from test chip yield data for a given process module layer using the test chip. It is desirable to reduce the variability in the observed yield PDF such that the mean observed yield increases. FIG. 11B is an illustration showing a new yield PDF 1103 based on application of a percent variance reduction target to the estimated yield PDF 1101, wherein the maximum of the new yield PDF 1103 is tied to the maximum of the estimated yield PDF 1101. For reference purposes, FIG. 11B also shows the estimated yield PDF 1101 from FIG. 11A.

With regard to FIG. 11B, the mean of the estimated yield PDF 1101 for the given process module layer is referred to as the current mean limited yield ($Y_C$). The mean of the new yield PDF 1103 for the given process module layer is referred to as the new mean limited yield ($Y_N$). The percent of variance reduction applied to the estimated yield PDF 1101 to arrive at the new yield PDF 1103 is referred to as the percent variance reduction target ($VR_T$). The process for obtained $Y_N$ from $Y_C$ given $VR_T$ is described as follows. Assume $Y_C$ is a vector or array holding wafer yield data for a given process module. An example of the distribution of $Y_C$ is shown as the estimated yield PDF 1101. The percent variance reduction target ($VR_T$) is set to a desired value, e.g., 0.3 for a 30% variance reduction target. A temporary yield vector ($Y_{temp}$), as shown in Equation 7, is then defined. Based on the temporary yield vector ($Y_{temp}$) and $Y_C$, the new yield PDF 1103 ($Y_N$) is defined a shown in Equation 8. With regard to Equation 8, max($Y_{temp}$) refers to the maximum of the $Y_{temp}$ vector, and max($Y_C$) refers to the maximum of the $Y_C$ vector. It should be understood that $Y_N$ as defined by Equation 8 is also a vector.

$$Y_{temp} = (1 - VR_T)Y_C, \quad \text{Equation 7}$$

$$Y_N = Y_{temp} - \max(Y_{temp}) + \max(Y_C) \quad \text{Equation 8}$$

Based on the reduction in yield variability between $Y_C$ and $Y_N$, an associated impact on candidate product yield is determined. Specifically, a product of the current mean limited yield ($Y_C$) for each process module layer within the test chip data is determined. This product represents the mean yield predicted by the test chip data without repair operations. Those skilled in the art will appreciate that some chip failures can be corrected by repair. Thus, the mean yield predicted by the test chip data can be corrected based on predicted repair capability to arrive at a test chip based mean yield prediction for a candidate product.

FIG. 12 is an illustration showing an exemplary application of the method for determining an estimated impact on candidate product yield due to reduction in yield variability associated with particular process modules. Each process module layer in the test chip data is identified. For each process module layer, a target limited yield ($Y_T$) is identified. Also, for each process module layer, an estimated limited yield is identified ($Y_C$). The estimated limited yield ($Y_C$) is based on the actual test chip yield data for each process module layer. The "virgin yield" row represents the observed yield for the entire test chip before repair. Therefore, the "virgin yield" is the product of the observed limited yield for each process module layer. The "predicted repair" row represents the estimated yield for the entire test chip following application of the predicted repair capability.

With reference back to FIG. 11B, the separation between the current mean limited yield ($Y_C$) and the target yield ($Y_T$) includes the separation between the current mean limited yield ($Y_C$) and the new yield ($Y_N$), and the separation between the new yield ($Y_N$) and the target yield ($Y_T$). The separation between the current mean limited yield ($Y_C$) and the new yield ($Y_N$) can be characterized by the ratio ($Y_C/Y_N$) which is referred to as the variability limited yield gap to target (VarLY), i.e., VarLY=($Y_C/Y_N$). The separation between the new yield ($Y_N$) and the target yield ($Y_T$) can be characterized by the ratio ($Y_N/Y_T$) which is referred to as the mean limited yield gap to target (Ygap), i.e., Ygap=($Y_N/Y_T$).

FIG. 12 shows the values of VarLY and Ygap for each process module layer in the given example. The product of VarLY for each process module layer within the test chip data is determined. With respect to FIG. 12, the product of VarLY across the process modules is 0.91. This product represents the fraction of yield loss that is due to variability of the yield from the target. To determine the amount of yield improvement that can be expected by reducing yield variability by the percent variance reduction target ($VR_T$), the percent difference is calculated between the observed test chip yield following repair and the variability limited yield gap to target (VarLY). With regard to the example of FIG. 12, this percent difference is calculated as [(0.52/0.91)−0.52] and corresponds to a yield improvement of 5%.

Figure 13:
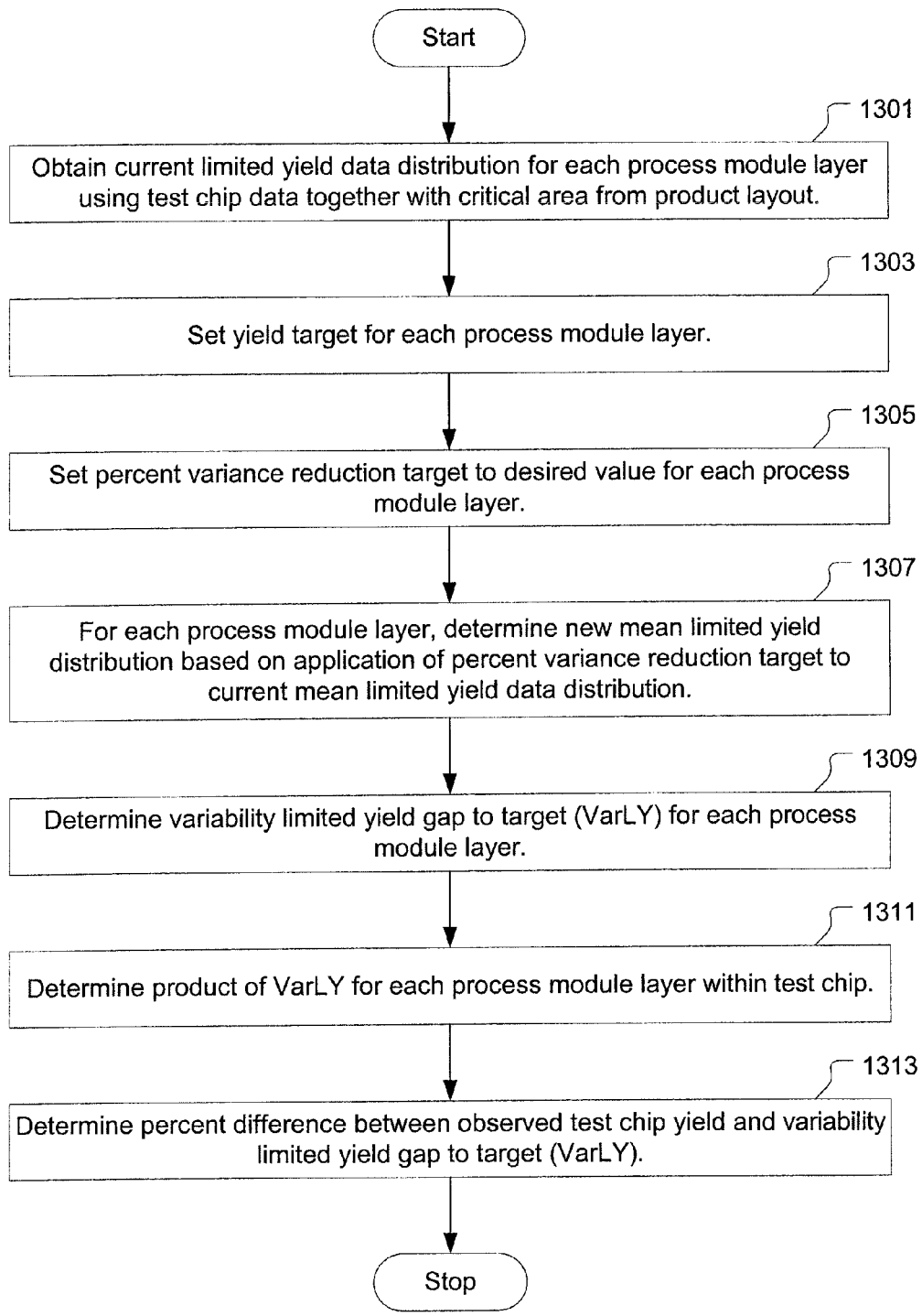
FIG. 13 is an illustration showing a flowchart of a method for determining an estimated impact on candidate product yield due to reduction in yield variability associated with particular process modules, in accordance with one embodiment of the present invention.

FIG. 13 is an illustration showing a flowchart of a method for determining an estimated impact on candidate product yield due to reduction in yield variability associated with particular process modules, in accordance with one embodiment of the present invention. The method of FIG. 13 incorporates the techniques described above with regard to FIGS. 11A, 11B, and 12. In the method of FIG. 13, operations 1301-1309 are performed for each process module layer within a test chip.

The method of FIG. 13 includes an operation 1301 for obtaining a current limited yield ($Y_C$) data distribution for each process module layer using test chip data together with critical area from product layout. In the operation 1303, the yield target ($Y_T$) is set. In the operation 1305, the percent variance reduction target ($VR_T$) is set to a desired value. In the operation 1307, the new mean limited yield ($Y_N$) distribution is determined as described above with regard to Equations 7 and 8. In the operation 1309, the variability limited yield gap to target (VarLY) is determined for each process module layer.

Following operation 1309, the method proceeds with an operation 1311 for determining the product of VarLY for each process module layer within the test chip. An operation 1313 is performed to determine the percent difference between the observed test chip yield and the variability limited yield gap to target (VarLY). The percent difference determined in operation 1313 represents the amount of yield improvement that can be expected by reducing yield variability by the percent variance reduction target ($VR_T$).

With the above embodiments in mind, it should be understood that the present invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network of coupled computer systems so that the computer readable code is stored and executed in a distributed fashion.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A computer system comprising:
a processor; and
memory coupled to said processor and having stored therein instructions that, if executed by said computer system, cause said computer system to execute a method for benchmarking product yield with respect to median defect density (DD), comprising:
generating a DD cumulative density function (CDF) for a baseline product that is based on actual yield measured during manufacturing of said baseline product over a first period of time;
generating a DD CDF for a candidate product that is based on actual yield measured during manufacturing of said candidate product over a second period of time;
determining a difference between the median DD of the candidate product and the median DD of the baseline product using the generated DD CDFs for the baseline and candidate products; and
assessing the difference between the median DD of the candidate and baseline products.

2. The computer system of claim 1, wherein in the method the baseline product and the candidate product are similar with respect to layout design and fabrication processes.

3. The computer system of claim 1, wherein the method further comprises:
deriving the DD CDFs for each of the candidate and baseline products from a respective DD probability density function (PDF).

4. The computer system of claim 1, wherein in the method the candidate product is within its yield ramp phase and the baseline product has completed its yield ramp phase.

5. The computer system of claim 1, wherein in the method the DD CDF for the baseline product is a full-wafer DD CDF, and the DD CDF for the candidate product is a full-wafer DD CDF.

6. The computer system of claim 1, wherein in the method the DD CDF for the baseline product is an edge limited DD CDF, and the DD CDF for the candidate product is an edge limited DD CDF.

7. The computer system of claim 6, wherein in the method the edge limited DD is defined by $$\text{Edge Limited } DD = \frac{-\ln(ELY)}{A_{chip}}, \text{ where } ELY = \frac{\text{Overall Yield}}{\text{Center Yield}},$$

wherein $A_{chip}$ is a total area of a chip on a wafer, overall yield is an overall chip yield of the wafer, and center yield is a chip yield within a central region of the wafer.

* * * * *